United States Patent
Lee

(10) Patent No.: US 7,310,271 B2
(45) Date of Patent: Dec. 18, 2007

(54) PROGRAM-VERIFY METHOD OF NON-VOLATILE MEMORY DEVICE

(75) Inventor: Min Kyu Lee, Kyeongki-do (KR)

(73) Assignee: Hynix Semiconductor Inc., Icheon-Si (KR)

( * ) Notice: Subject to any disclaimer, the term of this patent is extended or adjusted under 35 U.S.C. 154(b) by 0 days.

(21) Appl. No.: 11/400,587

(22) Filed: Apr. 7, 2006

(65) Prior Publication Data

US 2006/0227618 A1  Oct. 12, 2006

(30) Foreign Application Priority Data

Apr. 11, 2005 (KR) .................. 10-2005-0030076

(51) Int. Cl.
*G11C 11/34* (2006.01)
(52) U.S. Cl. ............... 365/185.22; 365/189.07; 365/185.23; 365/185.17
(58) Field of Classification Search ........... 365/185.22, 365/189.07, 185.23, 185.17
See application file for complete search history.

(56) References Cited

U.S. PATENT DOCUMENTS

| | | | |
|---|---|---|---|
| 5,754,469 A | 5/1998 | Hung et al. | |
| 6,147,190 A | 11/2000 | Goodearl et al. | |
| 6,853,585 B2 | 2/2005 | Lee et al. | |
| 7,020,017 B2* | 3/2006 | Chen et al. | 365/185.03 |
| 7,196,946 B2* | 3/2007 | Chen et al. | 365/189.07 |
| 7,218,552 B1* | 5/2007 | Wan et al. | 365/185.18 |
| 2004/0223371 A1 | 11/2004 | Roohparvar | |
| 2006/0221708 A1* | 10/2006 | Higashitani | 365/185.29 |
| 2006/0221709 A1* | 10/2006 | Hemink et al. | 365/185.29 |

FOREIGN PATENT DOCUMENTS

| | | |
|---|---|---|
| JP | 07-029383 A | 1/1995 |
| KR | 1997-0060242 A | 8/1997 |
| KR | 10-2004-0043363 A | 5/2004 |
| KR | 10-2005-0075548 A | 7/2005 |
| KR | 10-2006-0014342 A | 2/2006 |

* cited by examiner

*Primary Examiner*—Tuan T. Nguyen
(74) *Attorney, Agent, or Firm*—Townsend and Townsend and Crew LLP

(57) ABSTRACT

A method for programming a non-volatile memory device includes applying a first program-verify voltage to a first word line to determine whether or not memory cells associated with the first word line have been programmed successfully. A second program-verify voltage is applied to a second word line to determine whether or not memory cells associated with the second word line have been programmed successfully. The second program-verify voltage is different from the first program-verify voltage. The first and second word lines are associated with the same word line switching unit.

18 Claims, 4 Drawing Sheets

PROGRAM-VERIFY METHOD OF NON-VOLATILE MEMORY DEVICE

BACKGROUND

The present invention relates to a method of programming a non-volatile memory device. More particularly, the present invention relates to a program-verify method.

In general, there is an increasing demand for non-volatile memory devices which can be electrically programmed and erased and do not need the refresh function of rewriting data at regular intervals. The term "program" refers to the operation of writing data into the memory cells.

To increase the level of integration of memory devices, a NAND flash memory device in which a plurality of memory cells are connected in series (i.e., a structure in which neighboring cells share the drain or source) to form one string has been developed. The NAND flash memory device is a memory that sequentially reads information unlike the NOR flash memory device.

The distribution of threshold voltages (Vt) for cells being programmed (or program cells) in conventional NAND flash memory device at least partly determines the device performance, e.g., read margin. The threshold voltage (Vt) of the program cell is controlled by an incremental step pulse program (ISPP) for certain NAND flash memory device. More particularly, in the NAND flash memory device having multi-level cells, the distribution of the threshold voltage (Vt) of the program cell is one of the important factors that determines the device performance.

FIG. 1 shows a memory cell array of a general NAND flash memory device. In such a NAND flash memory device, if the ISPP is used, the cells MC0 to MC31 in a string may have slightly different threshold voltages (Vt) due to a back pattern dependency (BPD) effect and an interference effect. This causes the distribution of the threshold voltages (i.e., the differences in threshold voltages) of the memory cells to widen. This increased threshold voltage differences among memory cells may degrade a read margin in single level cells or multi-level cells and may also have an adverse effect on margin in-cycling and retention characteristics.

FIG. 2 is a graph showing the distribution of threshold voltages of the program cells using the ISSP.

Referring to FIG. 2, the program cell MC31 of the word line WL31 that is programmed last is not influenced by an interference cell threshold voltage (a state where threshold voltages of access cells are distorted according to threshold voltages of neighboring cells). Accordingly, it can be seen that the program cell MC31 of the word line WL31 has the distribution of a threshold voltage in a region different from those of the remaining program cells MC0 to MC30. Therefore, the threshold voltages of the program cells MC0 to MC31 in a string vary significantly; i.e., the cells have the threshold voltage distribution about 1.4 V.

SUMMARY OF THE INVENTION

The present invention relates to a method of programming non-volatile memory device. An embodiment of the present invention is directed to reduce the threshold voltage distribution among the program cells by applying different program-verify voltages to different groups of the word lines. In one implementation, the word line that is programmed last (first group) is applied with a different program-verify voltage than that applied to the other word lines (second group).

According to an exemplary embodiment of the present invention, there is provided a program-verify method of a non-volatile memory device including memory cells respectively connected to N (N is a natural number) word lines, the program-verify method includes the steps of (a) programming data into memory cells connected to a corresponding word line by applying a first voltage to a first word line of the N word lines to program a memory cell that is associated with the first word line; (b) determining whether the first word line is an $N^{th}$ word line corresponding to the last word line; (c) if it is determined that the first word line is not the $N^{th}$ word line, determining whether the programming has been successful or unsuccessful by applying a first program-verify voltage to the first word line; (d) if the programming is determined to have been successful in the step (c), selecting a second word line to program data into a memory cell associated with the second word line; and (e) if the first word line is determined to be the $N^{th}$ word line in the step (b), determining whether the programming has been successful or unsuccessful by applying a second program-verify voltage to the first word line in the step (b).

In one embodiment, a method for programming a non-volatile memory device includes applying a first program-verify voltage to a first word line to determine whether or not memory cells associated with the first word line have been programmed successfully. A second program-verify voltage is applied to a second word line to determine whether or not memory cells associated with the second word line have been programmed successfully. The second program-verify voltage is different from the first program-verify voltage. The first and second word lines are associated with the same word line switching unit.

BRIEF DESCRIPTION OF THE DRAWINGS

Embodiments of the present invention are illustrated using the accompanying drawings in which like reference symbols indicate the same or similar components, wherein.

DETAILED DESCRIPTION OF EMBODIMENTS

Figure 1:
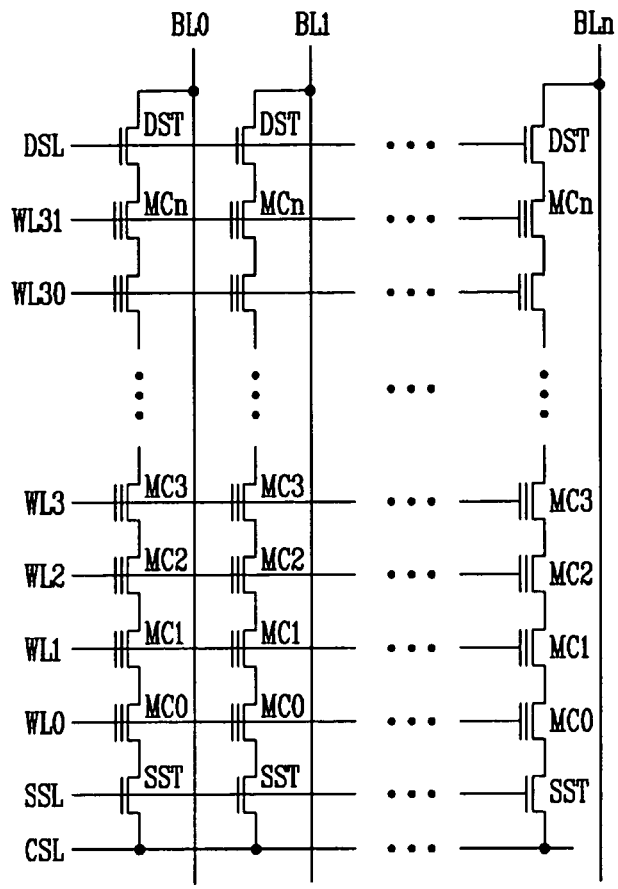
FIG. 1 shows a memory cell block of a general NAND flash memory device.
Figure 2:
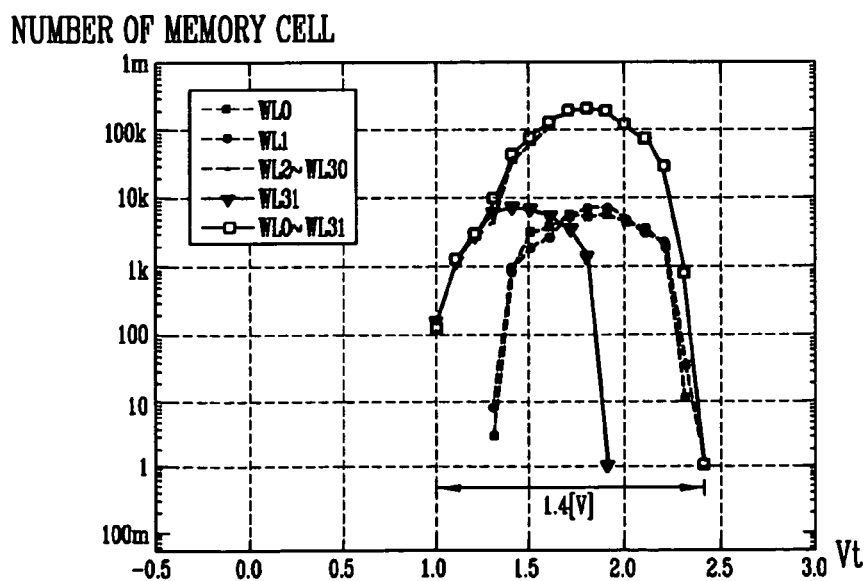
FIG. 2 is a graph showing the distribution of threshold voltages of the program cells of the NAND flash memory device shown in FIG. 1.

In the following detailed description, only certain exemplary embodiments of the present invention have been shown and described for illustrative purposes. As those skilled in the art will realize, the described embodiments may be modified in various different ways without departing from the spirit or scope of the present invention. Accordingly, the drawings and description are to be regarded as illustrative in nature and not restrictive. Like reference numerals designate like elements.

Figure 3:
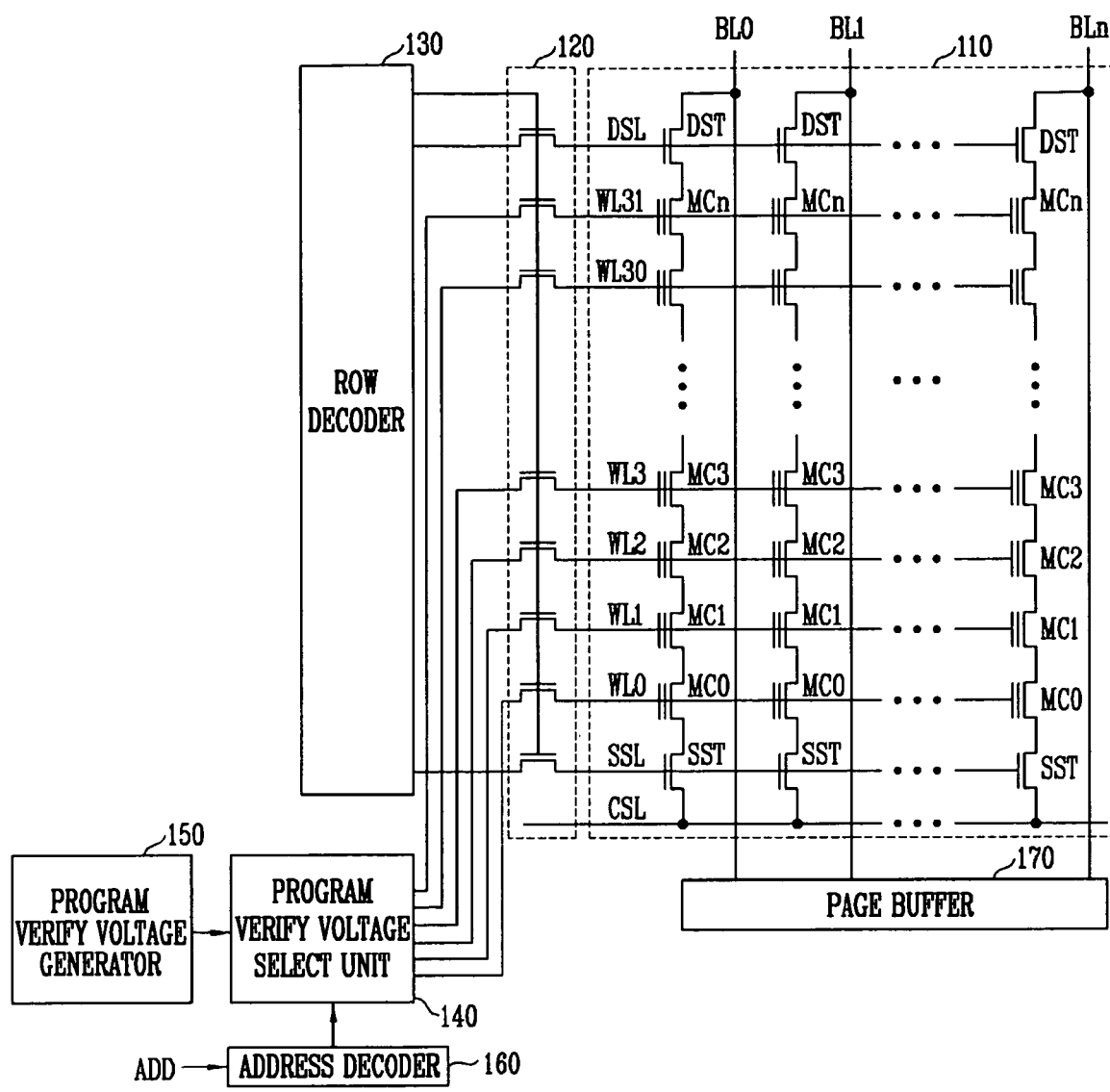
FIG. 3 is a block diagram showing a NAND flash memory device in which the threshold voltage distribution of memory cells can be narrowed according to one embodiment of the present invention.

FIG. 3 is a block diagram showing a NAND flash memory device in which the threshold voltage distribution of memory cells can be narrowed according to one embodiment of the present invention.

Referring to FIG. 3, the NAND flash memory device includes a memory cell block 110, a word line switching unit 120, a row decoder 130, a program-verify voltage select unit 140, a program-verify voltage generator 150, an address decoder 160 and a page buffer 170.

Referring to FIG. 3, the memory cell block 110 includes memory cells MC, a source select transistor SST and a drain select transistor DST. Each of bit lines BL1 to BLn serving as the drain is connected to the drain select transistor DST. A drain select line DSL is connected to a plurality of drain select transistors that are used to select a given string of memory cells. A common source line CSL serving as the source is connected to the source select transistors SST. These source select transistors are selected to select desired strings of memory cells.

The number of the memory cells MC connected in series between the drain select transistor DST and the source select transistor SST may be 16, 32 or 64 according to implementations. FIG. 3 shows a string having 32 memory cells, and N is 32. The memory cell (for example, MC1) may be controlled by a word line WL1 and forms one page. In FIG. 3, 32 pages are shown.

The program-verify voltage generator 150 generates a number of different program-verify voltages (for example, 0.8V, 1.0 V and 1.2 V) using a differential amplifier (not shown) and resistors (not shown). These different voltages are applied to different groups of word lines. Each group may have one or more word lines.

The program-verify voltage of 1.2 V is applied to the word line WL31 that is programmed last. That is, the memory cells that are connected to the word line WL31 are programmed after all other memory cells in the cell block have been programmed. The program-verify voltage of 0.8 V or 1.0 V is be applied to the other word lines WL0 to WL30.

The program-verify voltage select unit 140 receives the address of a word line from the address decoder 160 and transfers a program-verify voltage to the word line switching unit 120 to be applied to the selected word line.

The word line switching unit 120 applies the program-verify voltage to the selected word line in response to an output signal of the row decoder 130.

In the present embodiment, data are programmed into the memory cells MC0 to MC31 by applying the program voltages to the word lines WL0 to WL31 using the ISPP in order to secure the program speed. To remove the interference effect remaining in the word line WL31, the word line WL31 is applied with a program-verify voltage having a different level from that applied to the word lines WL0 to WL30. As a result, the interference effect is largely eliminated for the cell MC31, and the cell MC31 is provided with substantially the same threshold voltage as that of the other cells MC0 to MC30. Accordingly, the threshold voltage distribution for the memory cells in the cell block is reduced.

Figure 4:
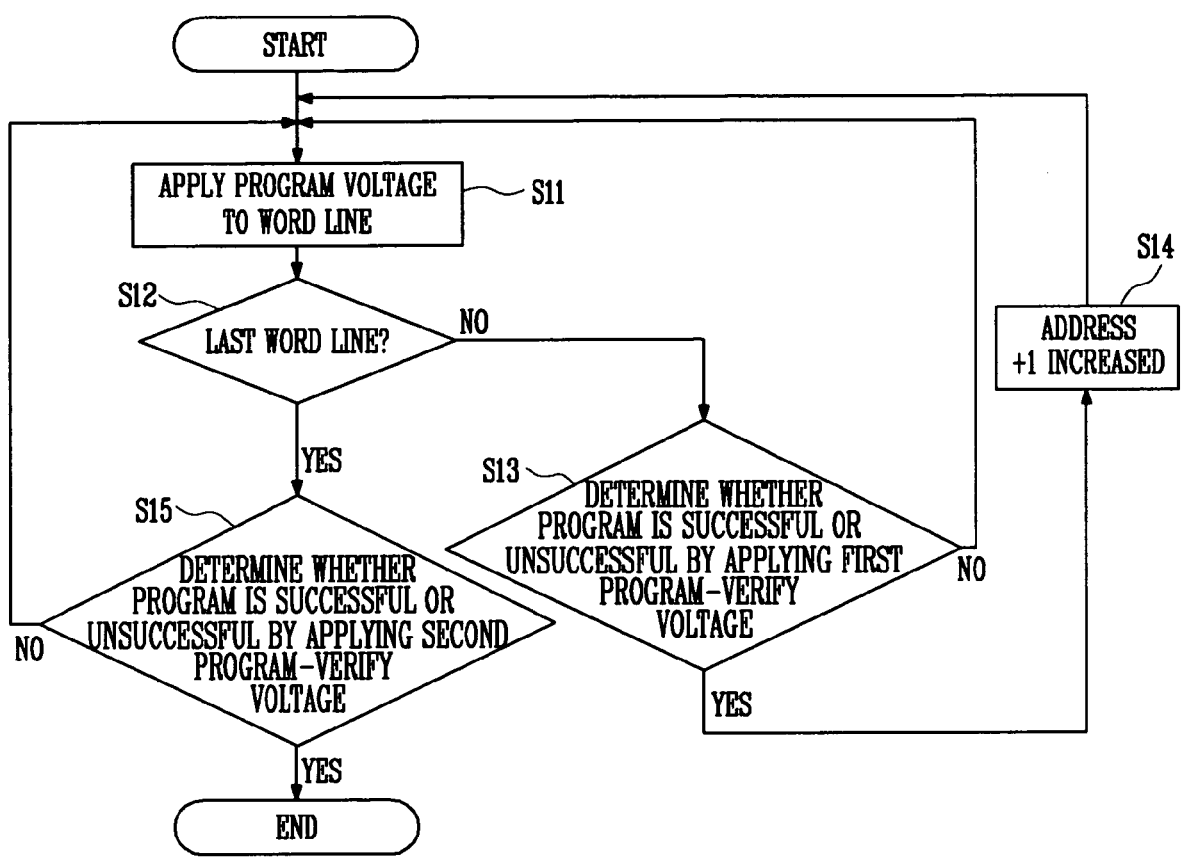
FIG. 4 is a flowchart illustrating a program-verify method of the NAND flash memory device according to one embodiment of the present invention.

FIG. 4 is a flowchart illustrating a program-verify method according to one embodiment. The method may be implemented using the NAND flash memory device shown in FIG. 3.

Referring to FIG. 4, data are programmed into memory cells connected to a corresponding word line WL0 by applying a program voltage to a first word line (for example, WL0) of the 32 word lines (step S11). The program voltage generally is much larger than the program-verify voltage. For example, the program voltage is 18 volts in the present embodiment, but may be different in other embodiments.

It is then determined whether the first word line WL0 is the last word line to be programmed (step S12). In the present embodiment, each string has 32 memory cells so the last word line is the cell MC 31. If the first word line WL0 is determined not to be the last word line, it is determined whether or not the programming has been successful by applying a first program-verify voltage (for example, 0.8V or 1.0V) to the first word line (step S13).

If the programming has been determined not to have been successful, the process returns to step S11 to reprogram the memory cells associated with the first word line WL0 by applying a program voltage. This time the program voltage is increased slightly, e.g., by 0.5 volt, from the previously applied program voltage. That is, 18.5 volts is used as the program voltage in the second attempt. The increase in the program voltage may be different in other embodiments. For example, the increase of the program voltage may be about 0.2 volts in a multi-level cell device.

Thereafter, it is determined once again whether or not the programming has been successful by applying the first program-verify voltages (for example, 0.8V or 1.0V) to the first word line (step S13). If it is determined not to have been successful, the above steps are repeated until the program is determined to have been successful, i.e., the program voltage is increased by a given amount (e.g., 0.5 V) after each attempt.

Once the programming has been determined to have been successful in step S13, the address for the next or second word line WL1 is selected (step S14). In the present embodiment, this is done by incrementing the address of the first word line by one. The process then returns to step S11 once the second word line has been selected, so that the second word line WL1 may be applied with a program voltage, and the memory cells associated with the second word line WL1 may be programmed.

The process proceeds to step S12 wherein it is determined whether the word line WL1 is the last word line (for example, WL31). Steps S11 to S14 are repeated until the word line selected is the last word line WL31. At step S12, if the selected word line is determined to be the last word line, it is determined whether or not the programming has been successful by applying a second program-verify voltage (for example, 1.2 V) to the word line (step S15).

If the programming is determined to have been unsuccessful in step S15, the process returns to step S11. The word line WL31 is applied with an increased program voltage, e.g., 18.5. It is then determined again whether or not the programming has been successful by applying the second program-verify voltage to the word line WL31. These steps are repeated until the programming is determined to have been successful. The program voltage is increased by a given amount after each attempt of programming.

Once the programming is determined to have been successful in step S15, this operation is terminated.

In one embodiment, the program-verify voltage of 1 volt is applied to the word lines WL0 to WL30, the program-verify voltage of 1.2 volt is applied to the word line WL31.

In another embodiment, the program-verify voltage of 0.8 volt is applied to the word lines WL0 to WL30, and the program-verify voltage of 1.2 volt is applied to the word line WL31.

Figure 5:
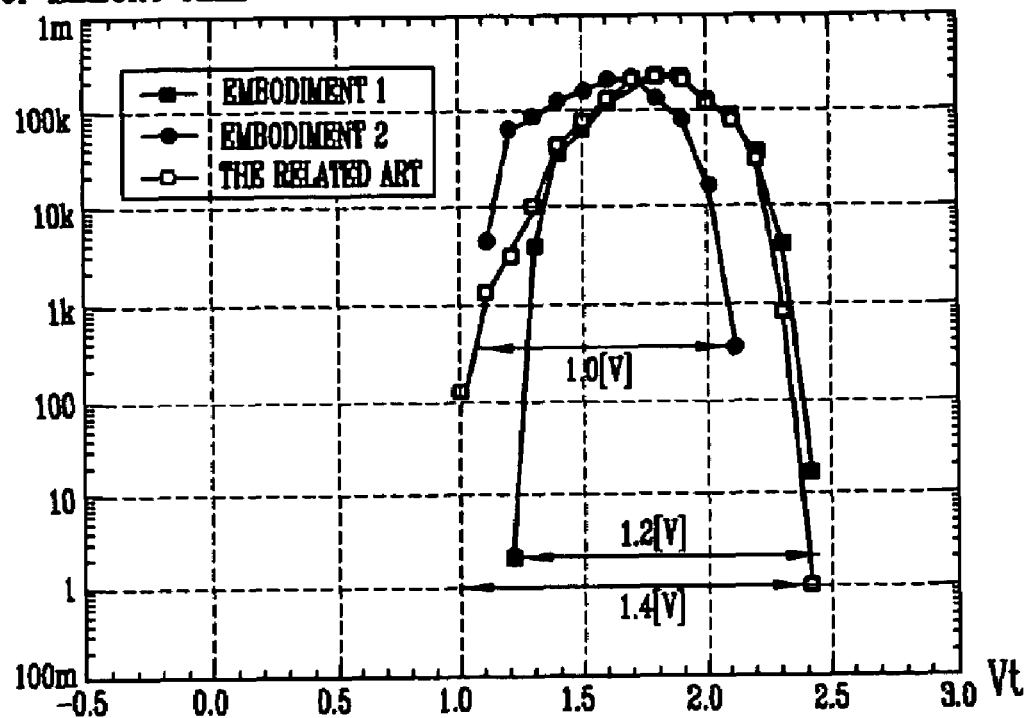
FIG. 5 is a graph showing the distribution of threshold voltages of the program cells of the NAND flash memory device according to one embodiment.

The threshold voltage distribution of program cells as shown in FIG. 5 is obtain by applying the last word line WL31 with a program-verify voltage with a voltage that is different from that applied to the word lines WL0 to WL30.

From FIG. 5, it can be seen that when a conventional program-verify voltage method is used, the range of the distribution of the threshold voltages of memory cells is 1.4V, whereas when a program-verify voltage method according to an embodiment of the present invention is used, the range of the distribution of the threshold voltages of the memory cells is reduced to 1.2 V. The range of the distribution of the threshold voltages is reduced to about 1 V when a program-verify voltage method according to another embodiment of the present invention is used.

As described above, according to embodiments of the present invention, the range of threshold voltage distribution of the program cells can be narrowed. Accordingly, since the read margin of a chip can be secured, the yield can be increased and robustness and reliability can be improved as well.

The invention has been described above using exemplary embodiments. Those skilled in the art will understand that the invention is not limited to the disclosed embodiments. The embodiments disclosed above may be modified or altered without departing from the scope of the present invention. The scope of the present invention should be interpreted using the appended claims.

What is claimed is:

1. A method for programming a non-volatile memory device including a plurality of memory cells, the method comprising:
   (a) applying a first voltage to a first word line to program a plurality of memory cells associated with the first word line, the first word line being one of word lines in a word line switching unit that is coupled to a memory cell block, the word line switching unit having N word lines, each word line being associated with a plurality of memory cells;
   (b) determining whether or not the first word line is an $N^{th}$ word line in the word line switching unit, the $N^{th}$ word line being a word line that is provided closest to a drain select line;
   (c) if the first word line is determined not to be the $N^{th}$ word line, applying a first program-verify voltage to the first word line to determine whether or not the programming has been successful;
   (d) if the programming is determined to have been successful in the step (c), applying the first voltage to a second word line in the word line switching unit to program a plurality of memory cells associated with the second word line; and
   (e) if the first word line is determined to be the $N^{th}$ word line in the step (b), applying a second program-verify voltage to the first word line to determine whether or not the programming has been successful.

2. The method as claimed in claim 1, further comprising:
   (f) determining whether or not the second word line is an $N^{th}$ word line in the word line switching unit; and
   (g) if the second word line is determined to be the $N^{th}$ word line, applying the second program-verify voltage to the second word line to determine whether or not the programming has been successful.

3. The method as claimed in claim 1, further comprising: if the first word line is determined to have been programmed unsuccessfully, applying a second voltage to the first word line to reprogram the memory cells associated with the first word line, the second voltage being higher than the first voltage.

4. The method as claimed in claim 1, further comprising: if the programming is determined to have been unsuccessful in the step (e), applying a second voltage to the first word line to reprogram the memory cells associated with the second word line, the second voltage being higher than the first voltage.

5. The method as claimed in claim 1, wherein the second program-verify voltage is higher than the first program-verify voltage.

6. The method as claimed in claim 1, wherein the second program-verify voltage is about 1.2 V, and the first program-verify voltage is about 1 V or less.

7. The method as claimed in claim 6, wherein the first program-verify voltage is 1.0V, 0.8 V, or less.

8. The method as claimed in claim 1, wherein the memory cells associated with the first word line are multi-level cells or a single level cells.

9. The method of claim 1, wherein the non-volatile device is a NAND flash memory device.

10. A method for programming a non-volatile memory device, the method comprising:
    applying a first program-verify voltage to a first word line to determine whether or not memory cells associated with the first word line have been programmed successfully; and
    applying a second program-verify voltage to a second word line to determine whether or not memory cells associated with the second word line have been programmed successfully, the second program-verify voltage being different from the first program-verify voltage,
    wherein the first and second word lines are associated with the same word line switching unit.

11. The method of claim 10, wherein the non-volatile memory device is a NAND flash memory device, the first and second word lines being provided between a source select line and a drain select line.

12. The method of claim 11, wherein N word lines are associated with the word line switching unit and the second word line is an $N^{th}$ word line.

13. The method of claim 11, wherein the word switching unit is associated with at least 16 word lines and the second word line is a word line that is closest to the drain select line.

14. The method of claim 13, wherein the first program-verify voltage is lower than the second program-verify voltage.

15. The method of claim 11, wherein the first and second word lines are associated with a given cell block in the non-volatile memory device, wherein at least two different program-verify voltages are applied to a plurality of word lines that are associated the given cell block to determine whether or not memory cells of the given cell block have been programmed successfully.

16. The method of claim 15, wherein the first program-verify voltage is 1 volt, 0.8 volt, or less, and the second program-verify voltage is 1.2 volt.

17. The method of claim 15, wherein the at least two different program-verify voltages are used to reduce the differences in threshold voltages of the memory cells in the given cell block.

18. The method of claim 15, wherein threshold voltages (Vt) of the memory cells are controlled by using an incremental step pulse program (ISPP) technique.

* * * * *